350-166
CROSS REFERENCE
SEARCH ROOM
136/89
X2685

Feb. 5, 1963 H. A. SAMULON ETAL 3,076,861

ELECTROMAGNETIC RADIATION CONVERTER

Filed June 30, 1959 2 Sheets-Sheet 1

INVENTORS
HENRY A. SAMULON
PAUL C. ROBISON
BY Jerry A. Dinardo
AGENT
Albert Rosen
ATTORNEY INVENTORS
HENRY A. SAMULON
PAUL C. ROBISON
BY Jerry A. Dinardo
AGENT
Albert Rosen
ATTORNEY United States Patent Office 3,076,861

Patented Feb. 5, 1963

3,076,861

ELECTROMAGNETIC RADIATION CONVERTER

Henry A. Samulon, Pacific Palisades, and Paul C. Robison, Los Angeles, Calif., assignors to Space Technology Laboratories, Inc., a corporation of Delaware Filed June 30, 1959, Ser. No. 824,111
4 Claims. (Cl. 136—89)

This invention relates to devices for converting solar radiation into electrical power, and more particularly to improvements designed to reduce the operating temperature of such devices.

Solar radiation converters are known which comprise a body of silicon, or other radiation responsive semiconductive material, in contact with two spaced electrodes to form a cell. When such a body is activated with small amounts of impurities, it will convert solar radiation impinging upon it into direct current electrical power. Such a cell is called a solar radiation converter, or more simply, a solar cell. In one type of a silicon solar cell the semiconductive body may comprise what is commonly known as a P–N semiconductive junction fabricated as two contiguous layers of a silicon wafer. One layer of the wafer contains an N type impurity such as arsenic. The other layer contains a P type impurity such as boron. A pair of electrodes are joined to the outer surfaces of the wafer to connect the cell to an external load.

Radiation responsive materials are generally sensitive only to radiation lying within a relatively narrow portion of the solar radiation spectrum. In the case of the silicon solar cell, for instance, this sensitive band lies approximately between .5 to 1.0 micron in wavelength, with the maximum sensitivity occurring at .8 micron. However, a substantial amount (approximately 25%) of solar radiation occurs at wavelengths shorter than .5 micron and likewise a substantial amount (approximately 27.3%) at wavelengths longer than 1.0 micron. Hence, while a silicon solar cell absorbs a large portion of the incident solar radiant energy, only a fraction (approximately 47.7%) of the absorbed radiant energy is useful for conversion into electrical energy. A substantial portion (approximately 52.3%) of the absorbed energy is converted into heat, thereby causing the solar cell to assume a relatively high operating temperature.

Since the conversion efficiency of a solar cell is reduced markedly with increasing temperature, the need for some sort of cooling means is readily apparent. In the past, the employment of external cooling means, such as heat sinks and blowers, has not proven entirely satisfactory because of the added weight and space requirements.

It is therefore an object of this invention to preserve from overheating solar radiation converters of the kind employing semiconductive cells.

It is a further object to provide an improved solar cell which is characterized by its increased conversion efficiency, low cost, and simplicity in construction.

The foregoing and other objects are realized in a solar radiation conversion device according to this invention which employs an integral filter that selectively preserves the device from overheating. The filter comprises a coating of materials applied in layers adjacent to a radiation receiving surface of the solar cell. The filter coating is of such materials and layer thicknesses as to transmit substantially only those wavelengths of incident solar radiation which are useful for conversion by the solar cell into electrical power. The other wavelengths of solar radiation, which are ordinarily dissipated in the form of heat in the solar cell without producing any useful electrical power, are reflected from the cell.

Figure 1:
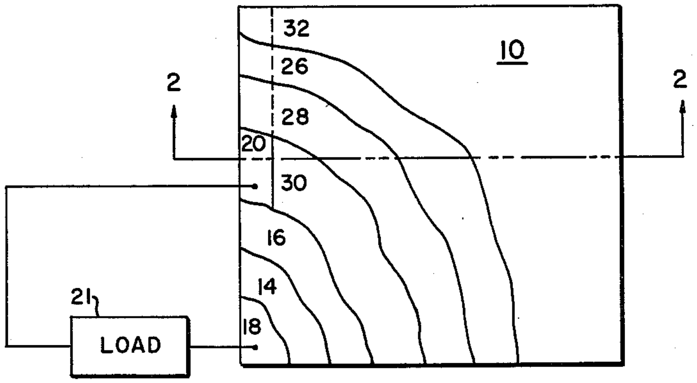
FIG. 1 is a plan view, with portions removed, of a solar radiation converter according to the invention.
Figure 2:
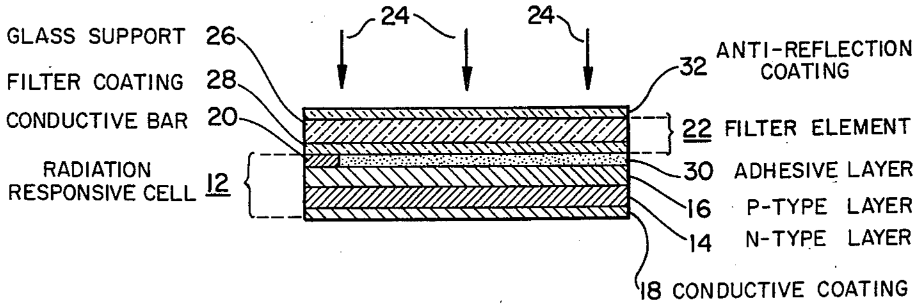
FIG. 2 is a sectional view taken along lines 2—2 of FIG. 1.

FIGS. 1 and 2 show one form of the invention as embodied in a solar radiation converter 10 in which the radiation-responsive semiconductive material is made of silicon. Silicon is preferred as the currently available material with the highest conversion efficiency. However, it will become apparent that the invention may be used with other radiation-responsive semiconductive materials, such a germanium. The solar radiation converter 10 comprises a member arranged in a sandwich structure. The converter 10 includes a radiation-responsive cell 12 having an N-type semiconductive layer 14 and a P-type semiconductive layer 16 joined together to form a semiconductive junction. A conductive coating 18 on the outer face of the N-type layer 14 forms one electrode of the cell 12. The other electrode is formed by a conductive bar 20 mounted on the outer face of, and extending along a peripheral edge of, the P-type layer 16.

The P–N junction formed by the two semiconductive layers 14 and 16 may be fabricated in conventional fashion from a single member or wafer of silicon activated in one of the conventional manners with an N-type impurity such as arsenic, and having an original thickness substantially equal to the combined layers 14 and 16. Thereafter, the arsenic-activated silicon wafer is infused with a P-type impurity, such as boron, to form a surface layer constituting the P-type layer 16. Thus the original arsenic-treated silicon member is converted to a semiconductive junction member made up of the N-type layer 14 and the P-type layer 16.

The electrodes of the converter 12, comprising the conductive coating 18 and the conductive bar 20, may be formed from low melting point solder or silver paste applied at a low temperature so as not to injure the semiconductive layers 14 and 16.

As is well known, solar radiation incident on the radiation receiving surface of the cell 12 (the outer face of the P-type layer 16) is converted by the cell 12 into direct current electrical power, as evidenced by a voltage developed across the electrodes 18 and 20. This generated voltage may be used to supply power to a load 21 connected across the electrodes 18 and 20.

In accordance with the invention, the radiation responsive cell 12 is provided with a reflective radiation filter element 22. The filter element 22 is mounted adjacent to the radiation receiving surface of the cell 12. In this case the radiation receiving face is the outer face of the P-type layer 16. The function of the filter element 20 is to transmit to the cell 12 only those wavelengths of the total incident solar radiation (exemplified by rays 24) to which the cell 12 is responsive. The filter element 20 reflects from the cell 12 other wavelengths lying outside of the useful band of wavelengths. In the absence of the filter element 22, these other wavelengths would be absorbed by the cell 12 and would cause the cell 12 to overheat, thereby reducing the cell's efficiency.

The filter element 22 may comprise a transparent glass support sheet 26 supporting a filter coating 28 on one side. The filter element 22 is joined to the cell 12 by a transparent adhesive layer 30, such as a layer of an epoxy resin cement, applied between the P-type layer 16 and the filter coating 28.

The filter coating 28 is here preferably one of the type known as an interference filter. It comprises a number of alternate layers of high and low index of refraction materials. In fabricating the filter coating 28, a high index of refraction material, such as zinc sulfide, is laid down on the substrate (glass sheet 26) and is followed by a layer of material, such as magnesium fluoride, which has a low index of refraction. This is followed by other layers of zinc sulfide and magnesium fluoride, laid down in that order until a total of between 5 and 12 layers are formed, depending upon the filter characteristics desired. This type of layered construction is illustrated in enlarged form in FIG. 4 as layers *48a* through *48f*. Each of the layers has a thickness equal to ¼ wavelength of radiant energy having a wavelength of approximately 400 millimicrons. The resultant filter is a selective reflector of a great portion of the wavelengths outside of the range (from about .5 to about 1.0 micron) to which the cell 12 is responsive.

A transparent anti-reflection coating 32, applied by vacuum deposition, covers the opposite side of the glass sheet 26. The coating 32 forms no part of the filter element 22. The anti-reflection coating 32 may be a single layer of magnesium fluoride deposited to a thickness equal to ¼ wavelength of radiation of about .8 micron in wavelength. The sensitivity of the silicon cell 12 is at a maximum at about .8 micron. The anti-reflection coating, which has an index of refraction less than that of the glass, minimizes the reflection of useful radiation.

The glass sheet 26 serves as mechanical protection for the converter 10. In addition, the sheet 26 provides auxiliary cooling for the silicon cell 12 by raising the long wavelength emissivity of the activated silicon layers 14 and 16. The need for this additional cooling arises from the fact that some of the long wavelength radiation that is absorbed by the silicon cell is converted into heat rather than electricity. Since silicon is a relatively poor emitter of long wavelength radiation, the temperature of the silicon cell would normally increase. However, glass is a good emitter of long wavelength radiation, so the glass sheet 26 counteracts the heating effect from this source to a large extent.

Figure 3:
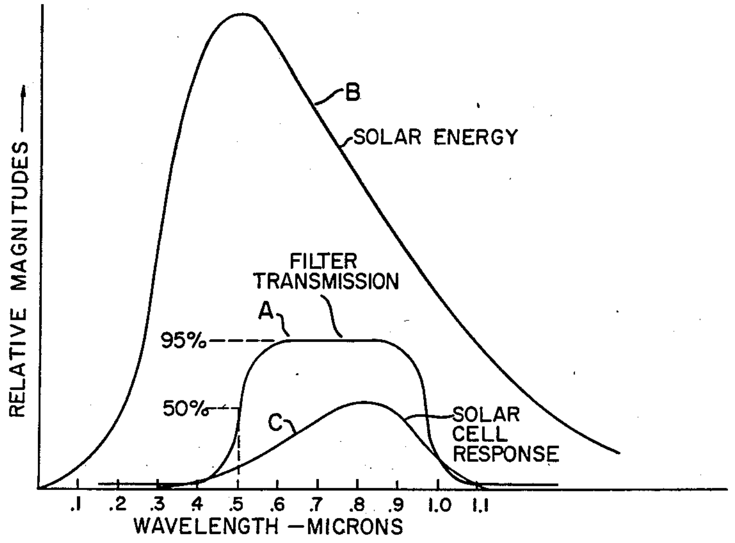
FIG. 3 is a graph showing the transmission characteristics of a filter according to the invention in relation to the energy spectrum of solar radiation and to the spectral response of a silicon solar cell.

In FIG. 3, the transmission characteristic of the filter element 22 is shown (Curve A) in relation to the energy spectrum of solar radiation (Curve B) and the spectral response (Curve C) of the radiation responsive cell 12. As shown in Curve A, the filter element 22 has less than 10% transmission for all short wavelength radiation up to just short of about .5 micron. At about .5 micron the transmission increases rather abruptly to 50% and at slightly beyond .5 micron it levels off to at least about 95% transmission. The transmission is maintained at about 95% up to about 1.0 micron, where is again falls off to relatively low values. Thus it is seen that the filter element 22 has little or no transmissivity to the shorter wavelengths (below .5 micron) wherein a substantial portion of the energy content of the solar radiation resides. However, it has high transmissivity to the longer wavelengths (between .5 and 1.0 micron) where the response of the cell 12 is the greatest. Maximum response of the cell is shown (in Curve C) to lie at about .8 micron. The filter element 22 thus limits the reception by the cell 12 to that band of wavelengths for which the cell 12 has maximum response.

Figure 4:
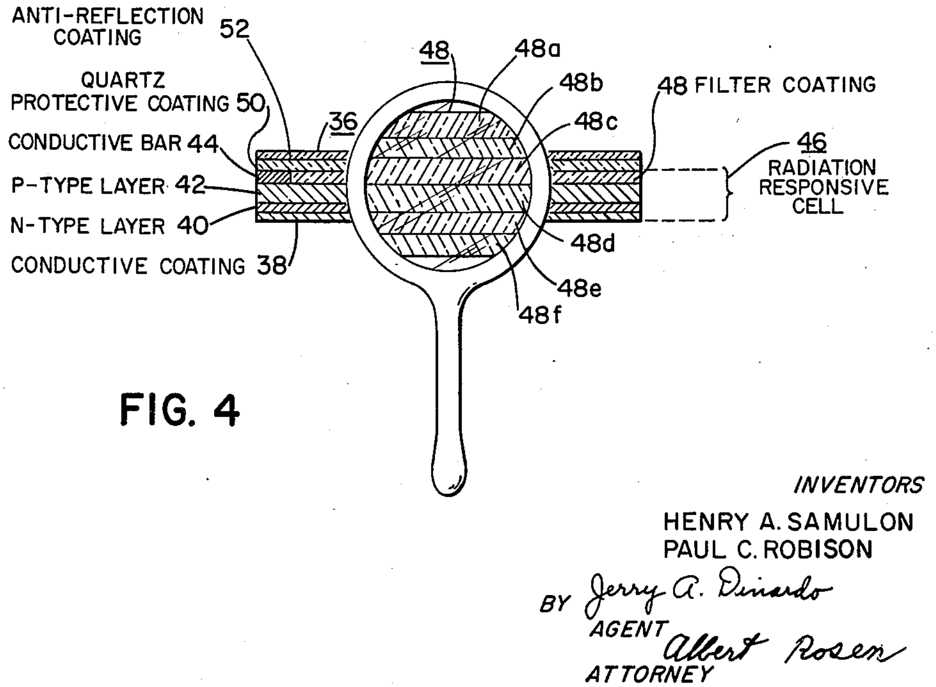
FIG. 4 is a sectional view, partially enlarged of a modification of the solar radiation converter according to the invention.

A more advantageous and simplified construction of a radiation converter 36 is shown in FIG. 4. This converter 36 uses a vacuum deposited arrangement in which the glass plate 26 and adhesive layer 30 of the embodiment of FIG. 1 are dispensed with. The converter 36 comprises a conductive coating 38, an N-type layer 40, a P-type layer 42, and a conductive bar 44, arranged in that order to form a radiation responsive cell 46.

A filter coating 48 is applied directly on the radiation receiving surface (layer 42) of the cell 12. The filter coating 48 may be applied by any of the known vacuum evaporation techniques, in a manner similar to that described above, for applying such coatings to glass. The coating 48 may otherwise have the same construction and transmission characteristics as the coating 28 of FIGS. 1 and 2.

A vacuum deposited quartz protective layer 50 and an anti-reflection coating 52, both applied by evaporation techniques, complete the converter 36. Here the quartz layer 50 serves the same purpose as does the glass support 26 in the first embodiment.

The substitution of the quartz layer 50 for the glass support 26, and the elimination of the adhesive layer, reduce the weight and bulk of the converter 36 in this embodiment. This may prove advantageous in certain environments to obtain the maximum number of such converters 36 within certain space and weight limitations. The dispensing with the use of a cementitious material joining the filter and conversion device avoids the energy absorbing and aging problems attendant the use of cements. Furthermore, the absence of cements allows the use of such converters 36 in radioactive environments where the presence of high energy radiation, such as protons, tends to cause ordinary adhesive materials to deteriorate to the point where they become relatively opaque to radiation useful to the converter.

It is now apparent that the invention provides a simple, low cost means of reducing overheating of solar energy conversion devices so as to increase their conversion efficiencies.

What is claimed is:

1. A solar radiation converter comprising means for converting electromagnetic energy into electrical energy, said means adapted to receive electromagnetic radiation lying substantially within a wavelength band of .5 to 1.0 microns, said means including a photoresponsive semiconductive member having a spectral sensitivity to said defined wavelength band for directly converting electromagnetic energy to electrical energy, and an interference filter bonded directly on said photoresponsive semiconductive member with the filter being in surface engaging relationship with the member for transmitting electromagnetic radiation within said wavelength band and reflecting substantially all other wavelengths of electromagnetic radiation not in said band.

2. An article of manufacture comprising a solar cell having an adjoining pair of semiconducting layers of different conductivity types forming a semiconducting junction, said layers being of material characterized by sensitivity to radiation in the bandwidth of from about .5 to 1.0 microns to produce electrical signals, the improvement for reducing the heating of said cell by radiation frequencies outside said bandwidth comprising a reflective thin film filter bonded directly to the surface of one of said semiconductive layers with the film being in surface engaging relationship with that of the layer, said filter being characterized by being transparent to radiation frequencies in the same frequency band as the sensitivity of the semiconducting layers and reflective to other radiation frequencies thereby preventing the heating of said semiconducting layers by said other radiation frequencies.

3. A solar radiation converter comprising an N type semiconductive layer and a P type semiconductive layer arranged to form a semiconductive junction therebetween, a sheet-like electrode mounted in electrically conductive contact with one of said layers, a bar-like electrode mounted in electrically conductive contact with the other of said layers and exposing at least a portion of said other of said layers for reception of solar radiation, said semiconductive layers being made of photoresponsive material operable to convert a wavelength band of approximately .5 to 1.0 micron into electrical power, and a filter coating bonded directly in intimate surface contact with and in solar radiation interception relationship with said portion of said other semiconductive layer, said filter coating being made of material of predetermined optical thickness as to be relatively identically transparent to radiation lying within said wave length band to which said semiconductive layers are photoresponsive and substantially reflective of radiation lying outside said band.

4. A solar radiation converter comprising an N type semiconductive layer and a P type semiconductive layer arranged to form a semiconductive junction therebetween, a sheet-like electrode mounted in electrically conductive contact with one of said layers, a bar-like electrode mounted in electrically conductive contact with the other of said layers and exposing at least a portion of said other of said layers for reception of solar radiation, said semiconductive layers being made of photoresponsive material operable to convert a wavelength band of approximately .5 to 1.0 microns into electrical power, and a filter coating bonded directly in intimate surface contact with and in solar radiation interception relationship with said portion of said other semiconductive layer, said filter coating being made of material of predetermined optical thickness as to be relatively identically transparent to radiation lying within said wave length band to which said semiconductive layers are photoresponsive and being substantially reflective of radiation lying outside said band, and a layer of quartz mounted in solar radiation interception relationship with said filter coating to thereby provide said converter with mechanical protection and provide an electromagnetically emissive surface for the radiative dissipation of heat.

References Cited in the file of this patent

UNITED STATES PATENTS

| | | |
|---|---|---|
| 2,036,457 | Calsow | Apr. 7, 1936 |
| 2,398,382 | Lyon | Apr. 16, 1946 |
| 2,668,478 | Schroeder | Feb. 9, 1954 |
| 2,780,765 | Chapin et al. | Feb. 5, 1957 |
| 2,932,592 | Cameron | Apr. 12, 1960 |

OTHER REFERENCES

Fink et al.: Trans. Electrochemical Society, 1934, vol. 66, p. 286.